(12) United States Patent
Cruz et al.

(10) Patent No.: US 7,358,617 B2
(45) Date of Patent: Apr. 15, 2008

(54) BOND PAD FOR BALL GRID ARRAY PACKAGE

(75) Inventors: Mark Gerald Muyco Cruz, Baguio (PH); Jerry Gomez Cayabyab, Baguio (PH); Ma. Celine Ramirez Mandapat, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 358 days.

(21) Appl. No.: 10/998,367

(22) Filed: Nov. 29, 2004

(65) Prior Publication Data

US 2006/0113684 A1 Jun. 1, 2006

(51) Int. Cl.
*H01L 23/40* (2006.01)
*H01L 23/52* (2006.01)
*H01L 29/40* (2006.01)

(52) U.S. Cl. ..................... 257/784; 257/783
(58) Field of Classification Search ............... 257/784, 257/786, 782, 783
See application file for complete search history.

(56) References Cited

U.S. PATENT DOCUMENTS

| | | | | |
|---|---|---|---|---|
| 4,771,330 A | * | 9/1988 | Long | 257/672 |
| 5,278,446 A | * | 1/1994 | Nagaraj et al. | 257/707 |
| 5,707,034 A | * | 1/1998 | Cotterill | 248/284.1 |
| 5,721,450 A | * | 2/1998 | Miles | 257/667 |
| 6,448,507 B1 | * | 9/2002 | Fontecha et al. | 174/260 |
| 6,538,305 B2 | * | 3/2003 | Ichinose | 257/666 |
| 6,661,083 B2 | * | 12/2003 | Lee et al. | 257/676 |
| 6,713,849 B2 | * | 3/2004 | Hasebe et al. | 257/667 |
| 7,116,557 B1 | * | 10/2006 | Raby et al. | 361/720 |
| 7,164,192 B2 | * | 1/2007 | Petty-Weeks et al. | 257/667 |
| 2004/0217487 A1 | * | 11/2004 | Low et al. | 257/780 |

* cited by examiner

*Primary Examiner*—S. V. Clark
(74) *Attorney, Agent, or Firm*—Wade J. Brady, III; Frederick J. Teleky, Jr.; Tum Thach

(57) ABSTRACT

A device (100) and a method (200) for controlling resin bleed, the device comprising a substrate (105) having a surface (107), an integrated circuit (115) having a plurality of leads (120) extending therefrom, and an adhesive (125) comprising a plurality of components. The adhesive (125) generally resides between the surface (107) of the substrate (105) and the integrated circuit (115), wherein the integrated circuit is generally bonded to the substrate. The device (100) further comprises a plurality of electrically-conductive bonding pads (122) associated with the surface (107) of the substrate and a plurality of studs (135) respectively formed over the plurality of bonding pads. A plurality of leads (120) are electrically connected to a top surface (137) of the each respective stud (135), wherein a height (140) of each stud is defined between the respective bonding pad (122) and the top surface of the stud, and wherein the height of the each stud generally prevents one or more of the plurality of components from bleeding onto the top surface thereof.

8 Claims, 3 Drawing Sheets

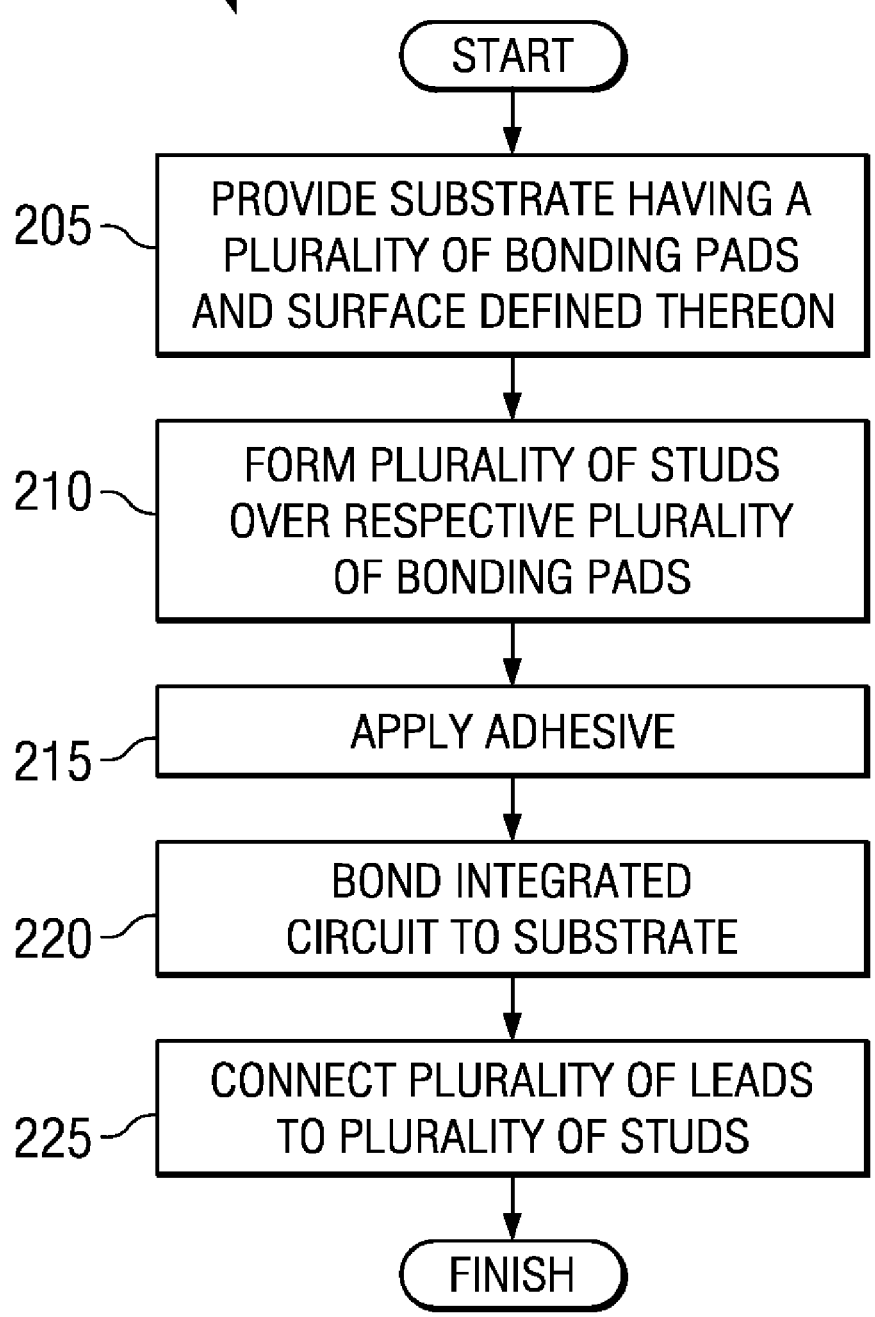

BOND PAD FOR BALL GRID ARRAY PACKAGE

FIELD OF THE INVENTION

The present invention relates generally to semiconductor devices, and more particularly to a device for controlling a bleeding of resin on a substrate.

BACKGROUND OF THE INVENTION

In the semiconductor processing industry, various individual components are combined in order to form an integrated device. For example, in flip-chip or wire-bond semiconductor processing, two or more components may be bonded to one another for purposes of electrical interconnection, heat dissipation, ease of manufacturing, or the like. For example, a conventional electronic device 10 is illustrated in FIG. 1A, wherein the device (e.g., a "ball grid array" package) may be electrically coupled to one or more other electronic components (not shown). The device 10, for example, comprises a plurality of solder balls (not shown) associated with the substrate, wherein the solder balls generally provide an electrical connection between the device and the other electronic component(s).

In a typical device 10, a die 12 is coupled to a substrate 14, wherein the die and substrate are physically bonded to one another, as well as electrically connected to one another. The die 12, for example, comprises an integrated circuit 15, wherein a plurality of electrically conductive leads 16 extend therefrom, and wherein the plurality of leads are operable to electrically connect the die to the substrate 14. In conventional processing, prior to electrically connecting the die 12 to the substrate 14, the die and substrate are physically bonded to one another via an adhesive 18 that has been applied to one or more of the die and the substrate. Conventionally, the adhesive 18 comprises a fluid-like epoxy that is operable to be cured by an application of heat thereto (e.g., a "baking" process), thus generally bonding the die 12 to the substrate 14.

Once the die 12 and substrate 14 are physically bonded to one another, the plurality of leads 16 associated with the die may be electrically connected to a plurality of bonding pads 20 associated with the substrate, thus electrically coupling the die to the substrate. For example, after the adhesive 18 is cured, each of the plurality of leads 16 is soldered to a respective bonding pad 20, wherein the plurality of leads are further operable to electrically connect the die 12 to the one or more other electronic components (not shown) associated with the device 10. In conventional processing, however, the connection of the leads 16 to the bonding pads 20 can be deleteriously affected if one or more constituents of the adhesive 18 bleeds onto one or more of the bonding pads 18. For example, in conventional processing, the adhesive 18 comprises a fluid-like resin 22 that will tend to bleed onto a surrounding region 24 of the surface 26 of the substrate 14 prior to the curing of the adhesive (e.g., during the time that elapses between the application of the adhesive and the baking process).

As illustrated in FIG. 1A, and further in the partial cross-section of FIG. 1B, such a bleeding of the resin 22 has a potential to contaminate one or more of the bonding pads 20, thus deleteriously affecting the bonding of the leads 16 thereto. For example, conventional bonding pads 20 are generally associated with the surface 26 of the substrate 14, wherein the bonding pads have been generally exposed in previous processing performed on the substrate, such as via an etching process performed on the surface of the substrate. Accordingly, a top surface 28 of each of the bonding pads 20 is generally associated with the surface 26 of the substrate 14. Consequently, the resin 22, upon bleeding into the surrounding region 24 of the surface 26 of the substrate 14, can easily bleed onto the top surface 28 of one or more of the bonding pads 20, such as by capillary action. Once the resin 22 has bled onto the top surface 28 of one or more of the bonding pads 20, capillary forces associated with the top surface of the bonding pads will have a tendency to pull even greater amounts of resin onto the bonding pads. Therefore, upon reaching the surrounding region 24, the resin 22 has a great potential to contaminate the top surface 28 of the bonding pads 20, wherein the contamination can deleteriously affect the electrical connection of the leads 16 thereto. For example, "non-stick" issues can arise, wherein the resin 22 residing on the top surface 28 of the bonding pad 20 generally causes a poor solder connection 30 between the lead 16 and the bonding pad, thus leading to a potential failure of the device 10.

Conventionally, undesirable affects from the bleed of resin 22 are minimized by providing a large bleed area 32 on the substrate 14 for the resin to bleed onto, thus locating the bonding pads 20 at a relatively large distance from the die 12. However, as real estate on substrates becomes more and more valuable due to ever decreasing sizes of associated electronic devices, providing such a large bleed area 32 becomes less practical. Accordingly, a need exists in the art for an economical device for preventing resin bleed onto bonding pads, such that a size of the device can be minimized, and wherein reliable electrical connections can be made between the respective leads and bonding pads.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward a bleed control device and method for controlling a bleed of resin on a substrate, wherein the bleed control device generally provides a more reliable electrical connection between various components than other conventional devices. In accordance with one exemplary aspect of the invention, the device comprises a substrate, such as a substrate for a ball-grid array package, wherein the substrate has a surface having an interior region and a peripheral region generally defined thereon. One or more electrical devices, such as an integrated circuit or flip chip are further associated with the interior region of the substrate.

In accordance with one aspect of the invention, the integrated circuit is bonded to the substrate via an adhesive, wherein the adhesive is comprised of a plurality of components, such as a fluid-like resin. The adhesive generally resides on the surface of the substrate in the interior region, wherein the integrated circuit generally resides over the adhesive, and wherein a bond between the substrate and the integrated circuit is generally defined. The integrated circuit, for example, comprises a plurality of leads extending therefrom, wherein the plurality of leads are operable to electrically connect the integrated circuit to one or more devices associated with the substrate.

In accordance with one exemplary aspect of the invention, the bleed control device comprises a plurality of electrically-conductive bonding pads associated with the surface of the substrate. For example, the plurality of bonding pads are generally associated with the surface of the substrate, wherein the substrate has been etched in order to reveal a top surface of the plurality of bonding pads. According to the present invention, a plurality of studs are formed over the respective plurality of bonding pads, wherein the plurality of leads are electrically connected to a top surface of the each respective stud. For example, the plurality of studs are comprised of a metal or a metal alloy, wherein the plurality of studs are electroplated or silk-screened onto the top surface of plurality of bonding pads, therein providing an electrical connection thereto.

According to another exemplary aspect of the present invention, a height of each stud is defined between the top surface of each respective bonding pad and the top surface of each stud. Each stud furthermore generally prevents one or more of the plurality of components of the adhesive from bleeding onto the top surface of the stud, due, at least in part, to the height of each stud. For example, the height of each stud is associated with a viscosity or bleed capacity of the resin. For instance, the height of each stud is between approximately ten microns and eighteen microns. The plurality of studs, for example, are formed over the plurality of bonding pads prior to the application of adhesive onto one or more of the integrated circuit and substrate, wherein the electrical connections of the studs to the bonding pads are substantially robust. The plurality of studs further generally prevent the bleed of resin from deleteriously contacting the top surface of the studs, therein advantageously affecting the electrical connection of the plurality of leads to the studs, and thus, the electrical connection of the integrated circuit to the substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3 is a block diagram of an exemplary method for controlling a resin-bleed on a substrate in accordance with another aspect of the present invention.

DETAILED DESCRIPTION OF THE INVENTION

Figure 1A:
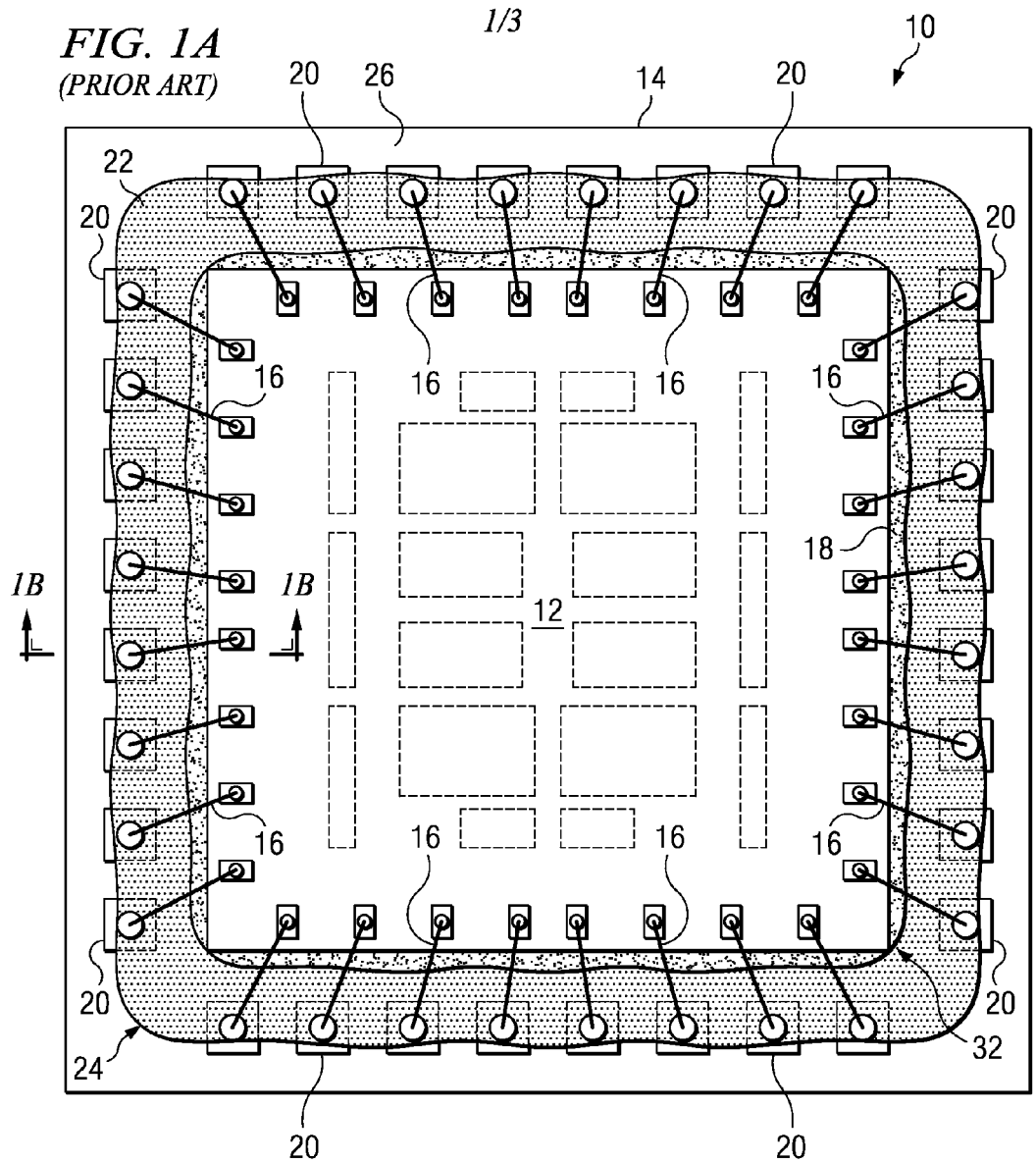
FIG. 1A is a plan view of a typical substrate illustrating a bleed of resin onto the substrate.
Figure 1B:
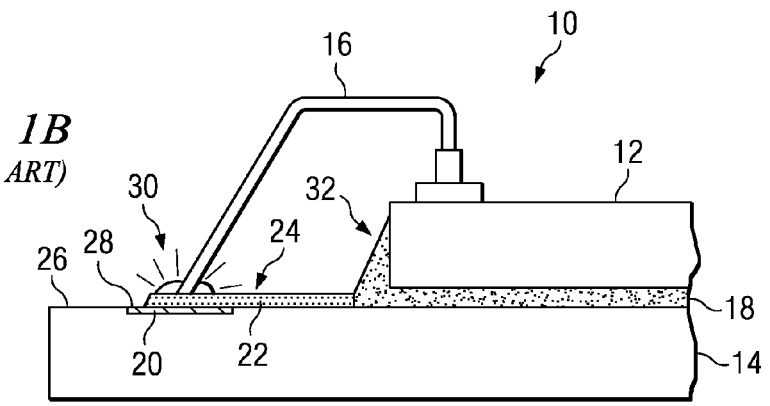
FIG. 1B is a partial cross-sectional view of the conventional substrate of FIG. 1A.

The present invention is directed towards a device for controlling a bleed of resin on a substrate. More particularly, the present invention provides a cost-effective solution for generally preventing resin bleed onto a bonding pad associated with the substrate. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2A:
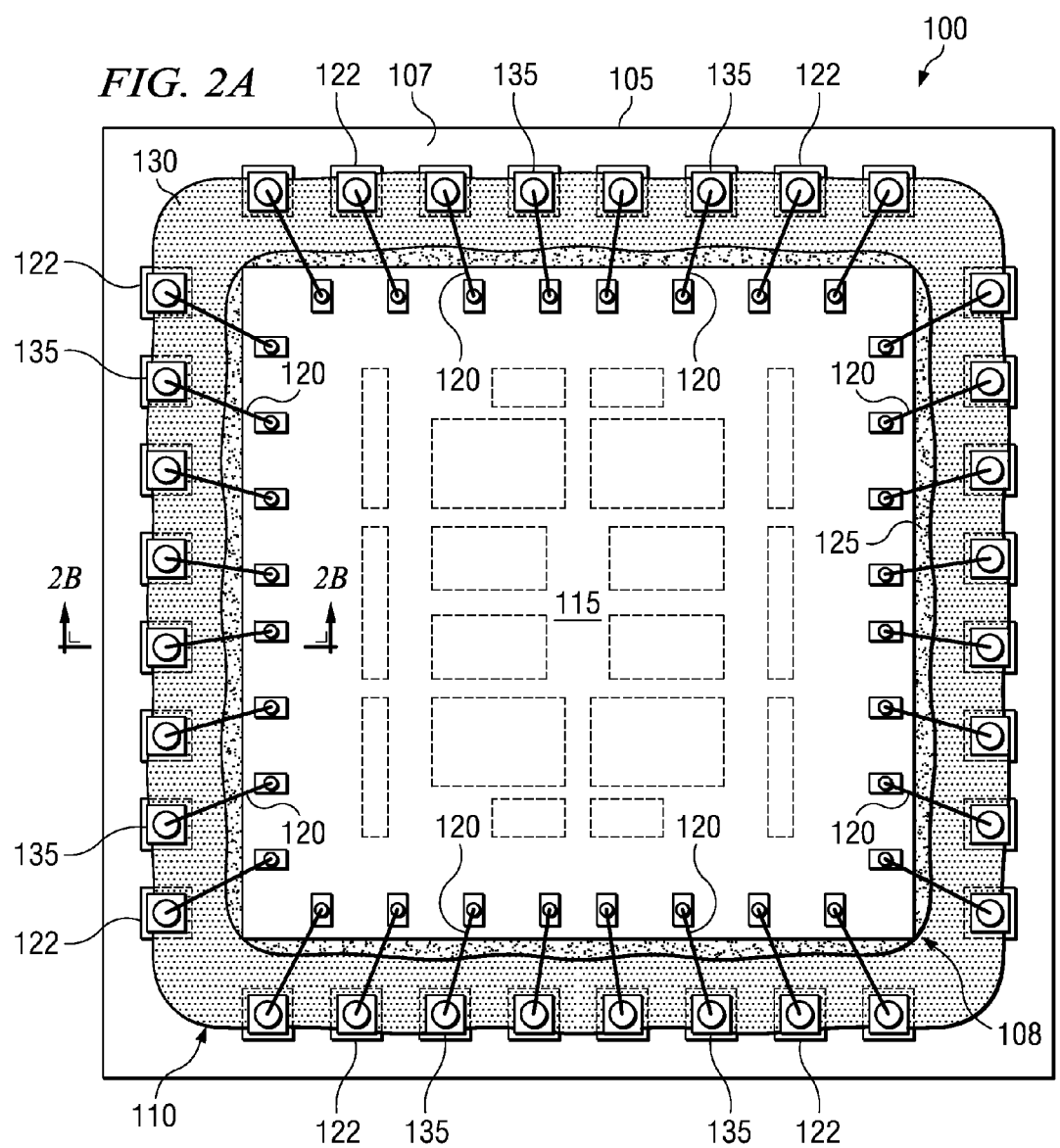
FIG. 2A is a plan view of an exemplary device for preventing resin bleed in accordance with one exemplary aspect of the present invention.

Referring now to the figures, FIG. 2A illustrates an exemplary assembled electronic device 100 in accordance with one aspect of the present invention. The device 100, for example, comprises a substrate 105, such as a printed circuit board (PCB) or a ceramic or semiconductive substrate, wherein a surface 107 of the substrate is generally defined. An interior region 108 and a peripheral region 110 of the surface 107 are further defined, wherein an integrated circuit 115 generally resides within the interior region of the assembled device 100. The integrated circuit 115, for example, comprises a plurality of leads 120, wherein the plurality of leads are electrically connected to the integrated circuit and extend therefrom. During an assembly of the device 100, the plurality of leads 120 are operable to be electrically connected to a plurality of bonding pads 122 (e.g., also referred to as "stitch pads") associated with the substrate 105, as will be discussed infra. The plurality of bonding pads 122, for example, are generally defined during a mask and etch process performed on the substrate 105, wherein the plurality of bonding pads are associated with a wiring layer (not shown) residing beneath the surface 107 of the substrate. Thus, the plurality of bonding pads 122 are generally exposed after the etch of the surface 107 of the substrate 105, wherein the plurality of leads 120 can be subsequently electrically connected thereto.

In accordance with one exemplary aspect of the invention, once the plurality of bonding pads 122 are defined, the integrated circuit 115 is generally affixed to the surface 107 of the substrate 105 in the interior region 108 thereof via an adhesive 125. For example, during the assembly of the device 100, the adhesive 125 is applied to one or more of the interior region 108 of the surface 107 of the substrate 105 and a backside (not shown) of the integrated circuit 115, wherein the integrated circuit is subsequently placed over the interior region, therein substantially adhering the integrated circuit to the substrate via the adhesive. The adhesive 125 may be further curable by an application of heat thereto (e.g., at a temperature of approximately 150° C.), wherein the integrated circuit 115 is generally bonded to the substrate 105 upon curing of the adhesive.

In one example, the adhesive 125 comprises of a thermoset epoxy, wherein the epoxy is further comprised of a plurality of components. For example, the adhesive 125 comprises a resin 130 that resin has a tendency to leech or bleed onto the surface 107 of the substrate 105 prior to, or during, the curing of the adhesive. Typically, after the adhesive 125 is applied, but prior to the adhesive curing, the resin 130 is operable to leach out of suspension from the adhesive and to bleed onto the peripheral region 110 of the surface 107 of the substrate 105. In conventional processing, such a bleed of resin 130 can have deleterious effects on the electrical connection of the plurality of leads 120 to the substrate 105, since the leads are conventionally soldered or stitched directly onto the bonding pads 122 after the adhesive 125 is cured. Thus, conventionally, if the resin 130 were to bleed onto one or more of the plurality of bonding pads 122 prior to the adhesive 125 curing, a respective one or more of the plurality of leads 120 may have a tendency to release from the respective bonding pad as a result of poor adhesion due to the resin, thus leading to a potential electrical failure.

Figure 2B:
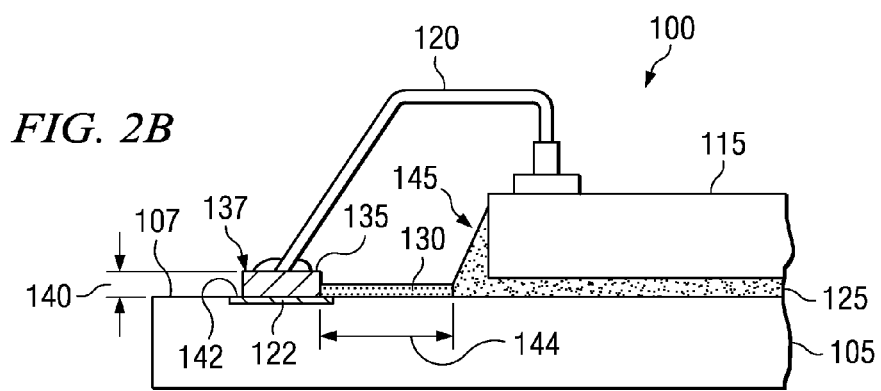
FIG. 2B is a partial cross-sectional view of the device of FIG. 2A in accordance with another exemplary aspect of the invention.

Therefore, in accordance with the present invention, a plurality of studs 135 are provided, wherein each stud is associated with a respective one of the plurality of bonding pads 122. The plurality of studs 135, for example, are formed over the plurality of bonding pads 122 prior to the application of the adhesive 125 onto the substrate 105, as will be discussed infra. FIG. 2B illustrates a partial cross-section of the device 100 of FIG. 2A, wherein the plurality of leads 120 electrically connect the integrated circuit 115 to the substrate 105 via the respective plurality of studs 135 and bonding pads 122. The bonding pads 122, for example, may be further electrically connected other wiring or components (not shown) associated with the substrate 105, wherein the device 100 is operable to be electrically coupled other electronic devices (not shown).

In accordance with the present invention, each of the plurality of studs 135, for example, is formed over the respective bonding pad 122 prior to the application of the adhesive 125 onto the surface 107 of the substrate 105. Each of the plurality of studs 135 further has a top surface 137 associated therewith, wherein a height 140 of each of the plurality of studs 135, for example, is generally defined by a distance between the top surface 137 of the stud and a top surface 142 of each bonding bad. The height 140 of the plurality of studs 135, for example, is determined based on several factors, such as one or more of a composition of the resin 130 (e.g., a viscosity associated with the resin), a composition of the plurality of studs (e.g., a surface finish of the studs), and a distance 144 between the plurality of bonding pads 122 and a fillet 145 of adhesive that is extruded after the joining of the integrated circuit 115 to the substrate 105. For example, the height 140 of the plurality of studs 135 (e.g., a height of approximately between 10 microns and 18 microns) is selected such that the resin 130 is generally prevented from bleeding onto the top surface 137 of the plurality of studs by gravitational force, wherein the top surface of each stud is substantially higher than the top surface 142 of the respective bonding pad 122. In accordance with another example, the height 140 of the plurality of studs 135 is provided such that a capillary action of the resin 130 is overcome by gravitational forces, thus generally preventing the resin from being pulled onto the top surface 137 of the plurality of studs. Accordingly, the plurality of studs 135 are operable to generally control the flow of resin 130, such that the resin is generally prevented from flowing onto the top surface 137 of each of the plurality of studs.

According to another exemplary aspect of the invention, the plurality of studs 135 are electrically conductive, and are operable to be formed or placed over the top surface 142 of each the respective plurality of bonding pads 122, thus providing an electrical connection to the plurality of bonding pads. For example, the plurality of studs 135 are comprised of a material that is electrically and physically compatible with the plurality of bonding pads 122, thus providing a good electrical connection between each respective stud and bonding pad. According to one example, the plurality of studs 135 are comprised of a similar material as the plurality of bonding pads 122. For instance, the plurality of studs 135 are comprised of a metal or metal alloy comprising one or more of copper, silver, gold, nickel, aluminum, and titanium, wherein the one or more metals are plated (e.g., electroplated) over the bonding pads 122. Alternatively, the plurality of studs 135 are soldered or otherwise coupled to the plurality of bonding pads 122 after the bonding pads are formed.

In another alternative, the plurality of studs 135 are formed over the plurality of bonding pads 122 by a silk-screening process. In yet another example, the bonding pads 122 are formed on the substrate 105 in conjunction with a formation of one or more other metal features (not shown) associated with the substrate, such as during a formation various wiring lines associated with the electrical connection of the integrated circuit 115 to the one or more other components (not shown). However, it should be noted that in order to achieve the acceptable height 140 of the plurality of studs 135, a separate formation process may be performed to form the plurality of studs, and any such formation is contemplated as falling within the scope of the present invention.

In a preferred embodiment, the plurality of studs 135 are comprised of copper or an alloy of copper, wherein the copper is electroplated to a height 140 of approximately 10-18 microns. As stated previously, the plurality of studs 135 advantageously provide a substantial differential in distance between the surface 107 of the substrate 105 and the top surface 137 of each stud, wherein such a differential generally prevents the bleed, or flow, of resin 130 onto the top surface of the plurality of studs. Again, preventing the resin 130 from bleeding onto the top surface 137 of each of the plurality of studs 135 generally permits a good electrical connection between the plurality of leads 120 and the plurality of studs. Accordingly, the plurality leads 120 can be soldered or otherwise electrically connected to the plurality of studs 135 in a highly reliable manner, wherein the electrical connections between the leads and studs is substantially robust. Furthermore, the plurality of studs 135 generally permit a tight ratio between a size of the integrated circuit 115 and a size of the substrate 105 (e.g., generally related to the substantially small distance 144 between the plurality of bonding pads 122 and the fillet 145 of adhesive 125), without sacrificing production yield due to non-stick of leads 120 caused by resin bleed 130.

According to still another exemplary aspect of the present invention, FIG. 3 is a schematic block diagram illustrating an exemplary method 200 for controlling a bleed of resin on a substrate. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 3, the method 200 begins with act 205, wherein a substrate, such as a printed circuit board or ceramic substrate, is provided, wherein the substrate has a surface associated therewith. In accordance with one exemplary aspect of the invention, an interior region and peripheral region of the surface are generally defined, wherein the substrate further comprises a plurality of bonding pads associated with the peripheral region of the surface. In act 210, a plurality of studs are formed over the respective plurality of bonding pads. For example, the plurality of studs are formed by electroplating or silk-screening a metal onto a top surface of the plurality of bonding pads, wherein a reliable electrical connection between the respective plurality of studs and bonding pads is formed.

In act 215, an adhesive is applied to one or more of the interior region of the substrate and an integrated circuit, wherein the integrated circuit comprises a plurality of leads extending therefrom. The adhesive, for example, comprises one or more components, such as a fluid-like resin. In act 220, the integrated circuit is placed over the interior region of the substrate, wherein the adhesive generally bonds the integrated circuit to the substrate. According to one example, the adhesive is then substantially cured, such as by an application of heat thereto. In act 225, the plurality of leads are electrically connected to a top surface of the respective plurality of studs, wherein a height of the studs generally prevents a bleed of one or more of the plurality of components onto the top surface of the plurality of studs.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A device for controlling a bleed of resin, the device comprising:
    a substrate having a surface;
    an integrated circuit having a plurality of leads extending therefrom;
    an adhesive comprising of a fluid-like resin and a plurality of components, wherein the adhesive generally resides between the surface of the substrate and the integrated circuit, therein generally bonding the integrated circuit to the substrate;
    a plurality of electrically-conductive bonding pads associated with the surface of the substrate; and
    a plurality of studs respectively formed over the plurality of bonding pads, wherein the plurality of leads are electrically connected to top surfaces of the plurality of studs, wherein a height of each stud is defined between a top surface of the respective bonding pad and the top surface of the respective stud, and wherein the height of each stud is dependent on a viscosity of the fluid-like resin to prevent the fluid-like resin and the plurality of components from bleeding onto the top surface thereof.

2. The device of claim 1, wherein the plurality of studs are comprised of one or more of a metal and a metal alloy.

3. The device of claim 2, wherein the plurality of studs are comprised of one or more copper, aluminum, gold, silver, nickel, and titanium.

4. The device of claim 2, wherein the plurality of studs are respectively electroplated over the plurality of bonding pads.

5. The device of claim 2, wherein the plurality of studs are respectively silk-screened over the plurality of bonding pads.

6. The device of claim 1, wherein the one or more of the plurality of bonding pads are electrically connected to one or more other electrical devices associated with the substrate.

7. The device of claim 1, wherein the height of each stud is between approximately ten microns and approximately eighteen microns.

8. The device of claim 1, wherein the substrate further comprises a ball-grid array.

* * * * *